United States Patent [19]
Fushinobu

[11] Patent Number: 6,127,765
[45] Date of Patent: Oct. 3, 2000

[54] MICRO-ELECTROMECHANICAL DEVICE

[75] Inventor: Kazuyoshi Fushinobu, Tokyo, Japan

[73] Assignee: Tokyo Institute of Technology, Tokyo, Japan

[21] Appl. No.: 09/256,984

[22] Filed: Feb. 24, 1999

[30] Foreign Application Priority Data

Feb. 24, 1998 [JP] Japan .................................. 10-041835

[51] Int. Cl.$^7$ .......................... H02N 10/00; H01L 21/302; B44C 1/22
[52] U.S. Cl. ................. 310/306; 216/52; 438/52
[58] Field of Search .............................. 310/306; 216/52; 438/52

[56] References Cited

U.S. PATENT DOCUMENTS

| | | | |
|---|---|---|---|
| 3,609,593 | 9/1971 | Boll et al. ................. | 310/306 |
| 5,772,902 | 6/1998 | Reed et al. .................... | 216/2 |
| 5,959,338 | 9/1999 | Youngner et al. ...................... | 257/459 |
| 6,040,611 | 3/2000 | De Los Santos et al. ............. | 257/415 |

OTHER PUBLICATIONS

Kazuyoshi Fushinobu, et al., Thermal Analysis of Silicon Films with Ultrashort–Pulse Laser Irradiation, Transactions of the Japan Society of Mechanical Engineers, May 1997.

K. Fushinobu, et al., Ultrashort–pulse laser heating of silicon to reduce microstructure adhesion, Int. J. Heat Mass Transfer., vol. 39, No. 15, pp. 3181–3186, 1996.

N.C. Tien, et al., Surface adhesion reduction in silicon microstructures using femtosecond laser pulses, Appl. Phys. Lett. 68(2), Jan. 8, 1996.

*Primary Examiner*—Thomas M. Dougherty
*Attorney, Agent, or Firm*—Knobbe, Martens, Olson & Bear, LLP

[57] ABSTRACT

A micro-electromechanical device, such as a micro-sensor or micromachine, includes a movable part in the form of a cantilever or diaphragm, which is formed on a substrate. In order to recover stiction in which the movable part is fixedly adhered to the substrate, a heating element is provided on a surface of the substrate which is opposed to the movable part. The heating element can be operated upon occurrence of stiction, so as to generate heat and thereby separate the movable part from the substrate and assure a proper operation of the device. The device can be produced at a relatively low cost, and achieves a stiction recovery with a high reliability, even when the device is enclosed in a package.

8 Claims, 4 Drawing Sheets

MICRO-ELECTROMECHANICAL DEVICE

BACKGROUND OF THE INVENTION

1. Field of the Invention

The present invention relates to a micro-electromechanical device having a movable part and, in particular, pertains to a micro-sensor, micromachine or the like.

2. Description of the Related Art

With the development of production process in the field of semi-conductors, such as LSIs, there are widely used highly miniaturized devices equipped with semi-conductors in various technical areas, as pressure sensors, velocity or acceleration sensors and the like. Also, based on the production process for such miniaturized devices, research and development are actively conducted with respect to micro-electromechanical devices or so-called micromachine.

As known in the art, micro-electromechanical device typically includes a substrate which is comprised of silicon or the like, and a movable functional part in the form of cantilever, diaphragm or the like, which has been formed on the substrate by micromachining process, so that the movement of the functional part relative to the substrate achieves the desired function of the device. This type of micro-electromechanical device often suffers from stiction, i.e., a phenomena by which the functional part is fixedly adhered to the substrate and the desired movement of the functional part becomes impossible to achieve, thereby causing malfunction or failures of the device. It is generally considered that stiction is caused during production or use of the device, when moisture in a space between the substrate and the functional part evaporates and a surface tension therebetween causes the functional part to be attracted and fixedly adhered to the substrate. It is highly desirable to prevent occurrence of stiction and/or achieve a satisfactory stiction recovery once stiction has occurred.

There have been proposals for overcoming the stiction problem of micro-devices, and reference may be had to *Appl. Phys. Lett.* 68(2), pp. 197–199, 1996; *Int. J. Heat Mass Transfer,* Vol. 39, No. 15, pp. 3181–3186, 1996; as well as *Transactions of the Japan Society of Mechanical Engineers,* Vol. 69, No. 609, pp. 253–258, 1997. According to such proposals, the movable part of a miniature device, which has been subjected to stiction, is irradiated by ultrashort-pulse laser having a pulse width of 1 picosecond ($10^{-12}$ sec.), such that the energy of the laser separates the movable part from the substrate to achieve the stiction recovery. However, besides that the laser device to be used is expensive, it is difficult to apply the proposed method to a micro-device which is hermetically enclosed in a package.

DISCLOSURE OF THE INVENTION

It is therefore a primary object of the present invention to provide an improved micro-electromechanical device which eliminates the above-mentioned problems.

It is a specific object of the present invention to provide an improved micro-electromechanical device which can be produced at a relatively low cost, and which includes a stiction recovery means for achieving a stiction recovery with a high reliability, even when the micro-device is enclosed in a package.

To this end, according to one aspect of the present invention, there is provided a micro-electromechanical device which comprises: a substrate having a first surface; and a functional element comprised of a movable part which is formed on the first surface of the substrate, wherein the movable part has a second surface which is opposed to the first surface of the substrate. The device according to the present invention further comprises a stiction recovery means in the form of a heating element provided on one of the first and second surfaces, wherein the heating element is operable to heat surface regions of the substrate and the movable part, which have been subjected to a stiction, so as to separate the movable part from the substrate.

In this instance, from the viewpoint of facilitated production of the device, it is preferred that the stiction recovery means is provided on the second surface of the movable functional part. The movable part of the device according to the present invention may comprise a cantilever or diaphragm.

According to another aspect of the present invention, there is provided a method for producing a micro-electromechanical device, which comprises the steps of: (i) preparing a substrate; (ii) forming a heating element on a surface of the substrate, wherein the heating element is adapted to achieve a stiction recovery of a movable functional part of the device; (iii) forming electrodes on the surface of the substrate, for supplying electric current to the heating element, (iv) forming a sacrificial layer on the surface of the substrate; (v) forming on the sacrificial layer a structure corresponding to the movable functional part; and (vi) subsequently removing the sacrificial layer from the surface of the substrate so as to form the movable functional part as being connected to the substrate.

According to still another aspect of the present invention, there is provided a stiction recovery method which is applicable to a micro-electromechanical device comprising a substrate, a functional element in the form of a movable part on the substrate, and a stiction recovery means in the form of a heating element which is arranged for one of opposite surfaces of the substrate and the part. The method according to the present invention comprises the step of operating the heating element and thereby heat surface regions of the substrate and the movable part, which has been subjected to stiction, for a duration of approximately 25 nanoseconds.

BRIEF DESCRIPTION OF THE DRAWINGS

The present invention will be more fully explained below with reference to preferred embodiments shown in the accompanying drawings, in which.

DESCRIPTION OF THE PREFERRED EMBODIMENT

Figure 1:
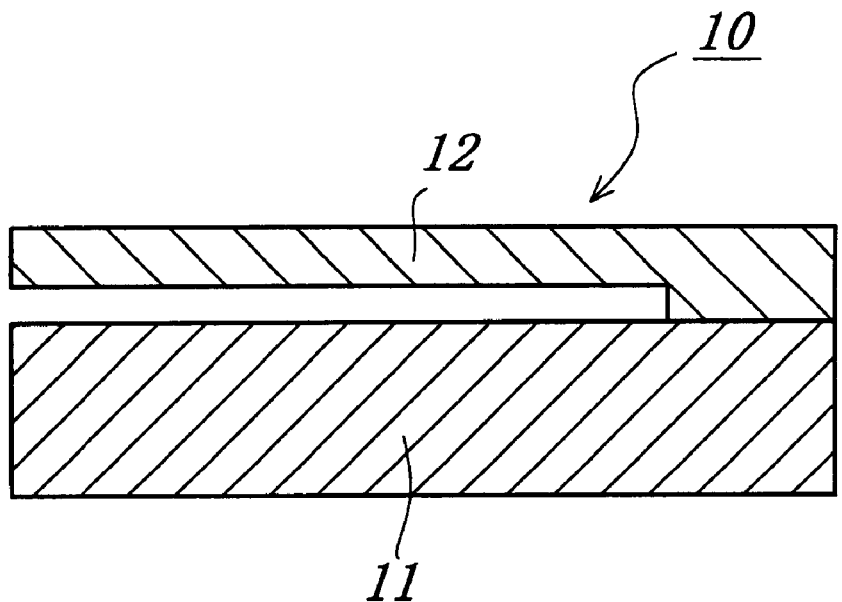
FIG. 1 is a schematic sectional view showing a conventional micro-sensor which includes a movable part on a substrate.
Figure 2:
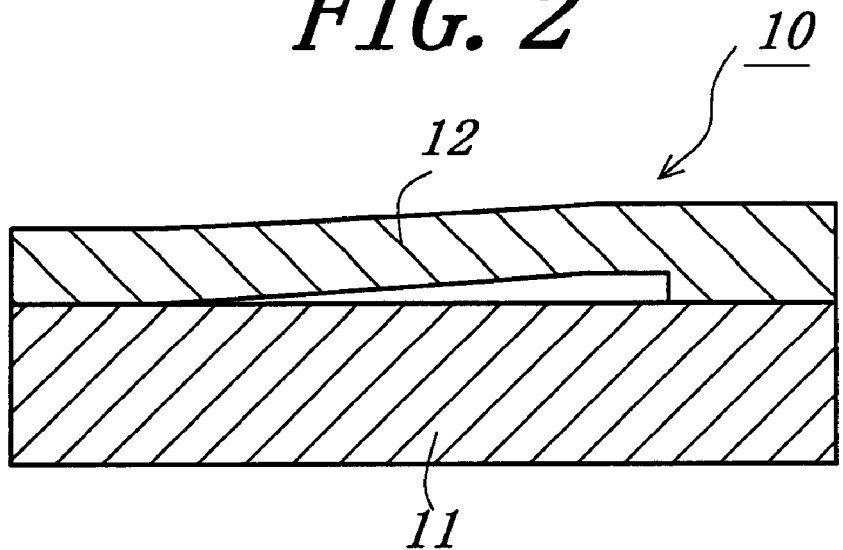
FIG. 2 is a schematic sectional view showing the micro-sensor of FIG. 1 after occurrence of stiction.

Referring now to the drawings, the present invention relates to a micro-electromechanical device in the form of micro-sensor or micromachine, a typical example of which is shown in FIGS. 1 and 2. The device as a whole is designated by reference numeral 10, and includes a substrate 11 which may be comprised of silicon, and a movable functional part 12 in the form of a cantilever which has been formed on the substrate 11 by a micromachining process in a manner known, per se. As mentioned above, this type of known device suffers from a stiction problem wherein, as particularly shown in FIG. 2, the functional part 12 is fixedly adhered to the substrate 11 so that it becomes difficult or impossible for the device 10 to properly perform the desired function.

Figure 3:
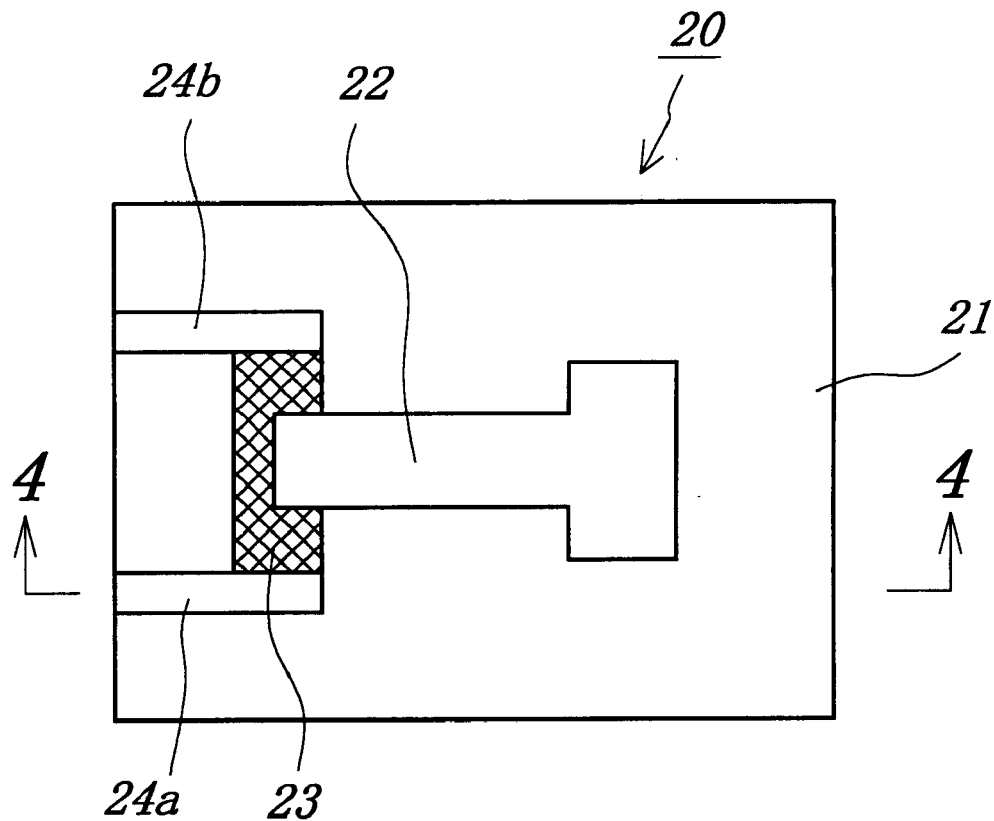
FIG. 3 is a plan view of a micro-electromechanical device according to one embodiment of the present invention.
Figure 4:
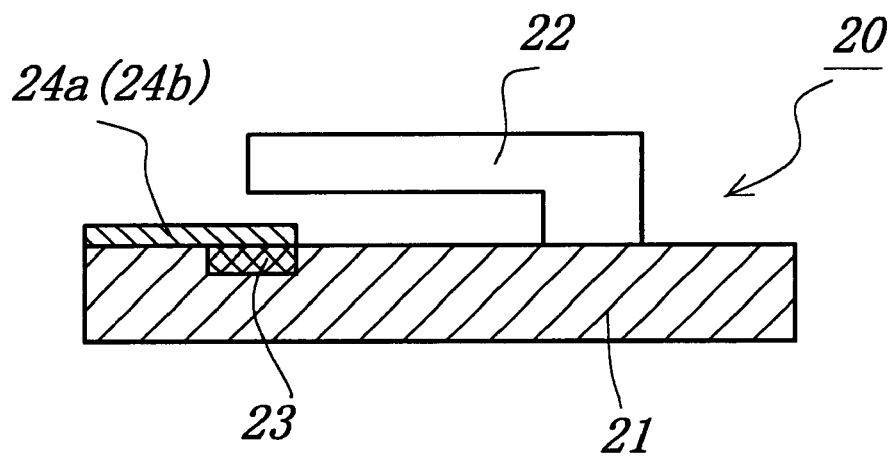
FIG. 4 is a sectional view taken along the line 4—4 in FIG. 3.
Figure 5:
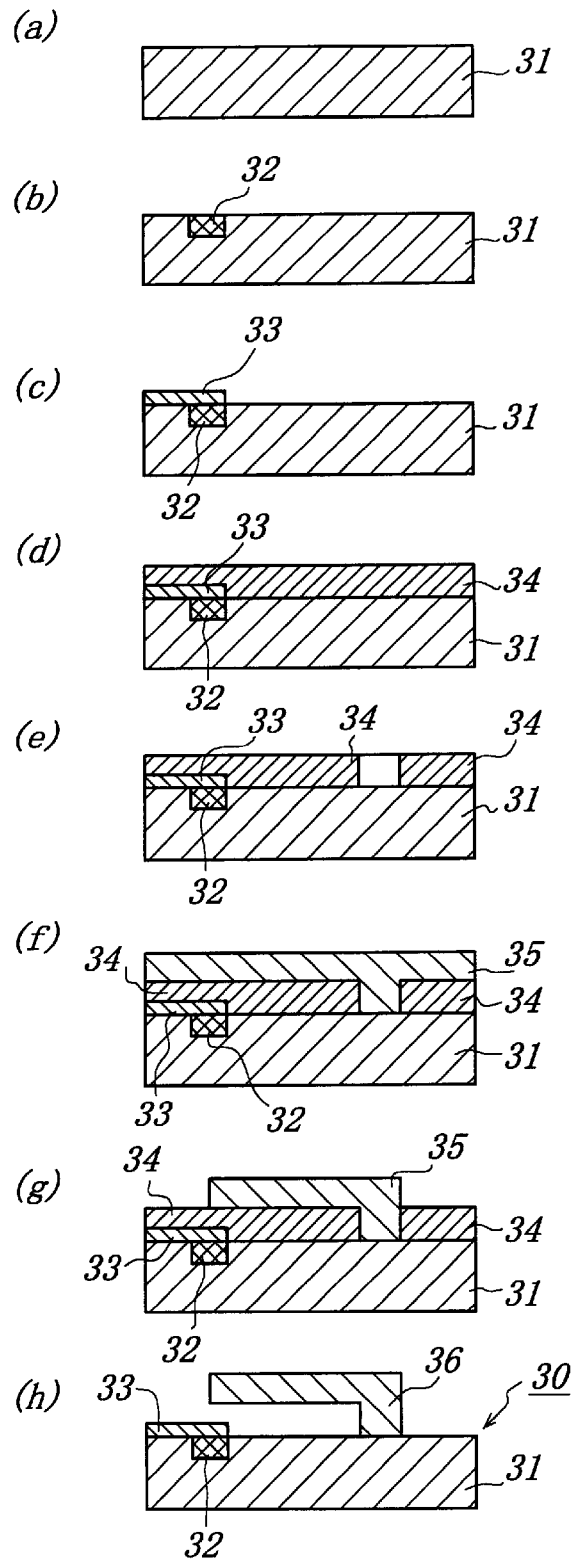
FIG. 5 is a diagram showing the production steps of the device according to the present invention.

A micro-electromechanical device according to one embodiment of the present invention is shown in FIGS. 3 and 4, and designated as a whole by reference numeral 20. The device 20 includes a substrate 21 comprised of silicon, and a functional part in the form of a cantilever 22 which has been formed on the substrate 21. The cantilever 22 is movable relative to the substrate 21, by applying a voltage across terminals which are not shown. The substrate 21 is further formed with a resistor 23 and electrodes 24a, 24b which are connected to the respective ends of the resistor 23. The resistor 23 is arranged at that surface region of the substrate 21, which is opposed to the lower surface of the cantilever 22. When electric current is supplied to the resistor 23 through the electrodes 24a, 24b, the resistor 23 functions as a heating element and generates heat. Therefore, after occurrence of a stiction between the cantilever 22 and the substrate 21, the resistor 23 is supplied with electric current in order that the generated heat separates the cantilever 22 from the substrate 21.

It is considered that, due to the operation of the heating element 23, the cantilever 22 is separated from the substrate 21 under the following mechanism. That is to say, when electric current is supplied to the heating element 23 through the electrodes 24a, 24b to generate heat, those surface regions of the cantilever 22 and the substrate 21 which have been subjected to stiction are locally heated. As a result, thermal vibration is induced in the crystal lattice at such surface regions of the substrate 21 and the cantilever 22, so that mutually bonded atoms are separated from each other and the cantilever 22 is thereby separated from the substrate 21 to recover the stiction. It has been confirmed that application of electric current to the heating element 23 for the duration of approximately 25 nanoseconds ($25 \times 10^{-9}$ sec.) is generally sufficient to satisfactorily achieve the stiction recovery, without causing damages to peripheral surface regions of the substrate and the cantilever.

FIG. 3 schematically shows successive steps (a) to (h) in a preferred method for producing micro-electromechanical devices according to the above-mentioned embodiment of the present invention. A first step (a) is to prepare a substrate 31 of a desired shape, which is comprised of appropriate material, such as silicon. In a second step (b), either n-type or p-type impurity is injected into a surface of the substrate 31 to form a resistor 32. In a third step (c), electrodes 33 are formed on the surfaces of the substrate 31 and the resistor 32, such that the electrodes 33 are connected to the respective mends of the resistor 32. In a fourth step (d), a sacrificial layer 34 is formed on the substrate 31 to cover the surfaces of the substrate 31, resistor 32 and electrodes 33. In a fifth step (e), the sacrificial layer 34 is then locally removed to form an opening which corresponds to a portion of the cantilever to be further described below. In a sixth step (f), there is formed a polycrystalline silicon layer 35 on the sacrificial layer 34, which covers the surface of the sacrificial layer 34. The polycrystalline silicon layer 35 corresponds to the movable functional part of the device, and thus extends into the opening such that it is integrated with the surface of the substrate 31. In a seventh step (g), the polycrystalline silicon layer 35 is locally subjected to etching and thereby removed so as to define the shape of a cantilever 36 as the functional part of the device. In a eighth step (h), the remaining sacrificial layer is completely removed by etching process, to complete production of a micro-electromechanical device 30.

Figure 6:
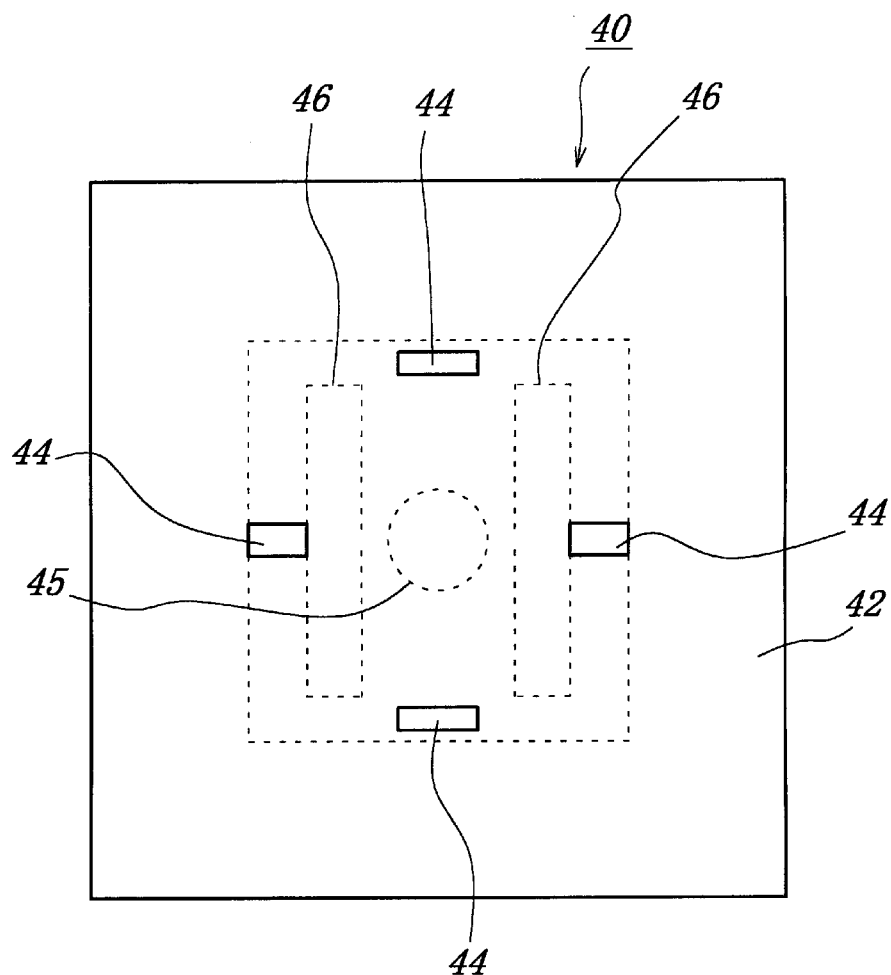
FIG. 6 is a plan view of a micro-sensor according to another embodiment of the present invention.
Figure 7:
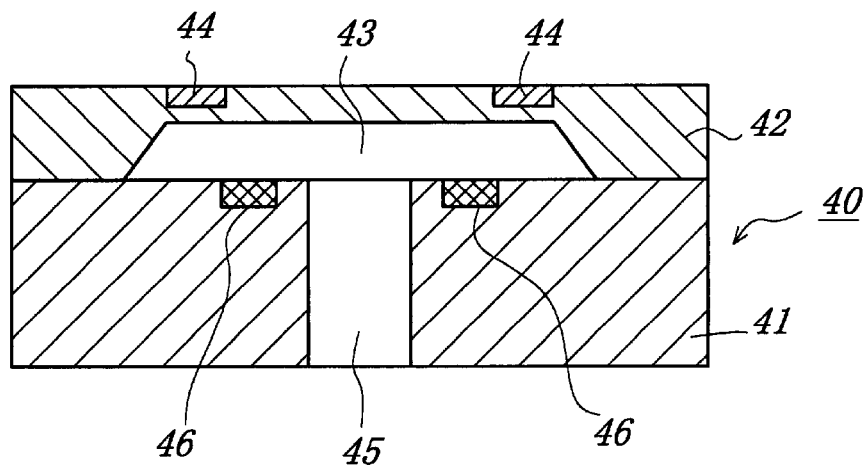
FIG. 7 is a side view of the micro-sensor shown in FIG. 6.

Another embodiment of the micro-electromechanical device according to the present invention is shown in FIGS. 6 and 7, which is applied to a pressure sensor including a movable part in the form of a diaphragm. More particularly, the micro-sensor 40 includes a silicon substrate 41 having an upper surface on which a silicon diaphragm 42 is formed such that a space 43 is left between the upper surface of the substrate 41 and the lower surface of the diaphragm 42 in its central region. Strain gauges 44 are formed on the diaphragm 42, which convert strain of the diaphragm as a result of its deformation, into electrical signals. Thus, when a fluid is introduced into the space 43 through an opening 45 in the substrate 41, and the diaphragm 42 is subjected to deformation by the pressure of the fluid, the resultant strain of the diaphragm 42 is converted into electrical signals by the strain gauges 44. The upper surface of the substrate 41 in its region of the space 43 is provided with heating elements 46, which serve to achieve stiction recovery for the diaphragm 42.

It will be appreciated from the foregoing description that the present invention provides an improved micro-electromechanical device which can be produced at a relatively low cost, and which includes a stiction recovery means for achieving a stiction recovery with a high reliability, even when the device is enclosed in a package.

While the present invention has been described with reference to certain preferred embodiments, it is apparent that various modifications or variations are possible without departing from the scope of the invention as defined by the appended claims.

For example, instead of heating elements, the stiction recovery means of the micro-electromechanical device may be comprised of a laser device, e.g., a surface-emitting type laser device. In this instance, it is of course that the laser device is formed on the substrate during production of the micro-electromechanical device. Also, when the movable part of the micro-electromechanical device comprises a movable part in the form of a rotatable element, the stiction recovery means or heating elements may be provided for a bearing which rotatably supports the movable part. Moreover, when the micro-electromechanical device comprises a plurality of movable parts and there is a tendency that stiction occurs between the movable parts, the stiction recovery means or heating elements may be provided for the movable part themselves.

What is claimed is:

1. A micro-electromechanical device comprising:
a substrate having a first surface;
a functional element comprised of a movable part which is formed on said first surface of the substrate, said movable part having a second surface which is opposed to said first surface of the substrate; and
a stiction recovery means in the form of a heating element provided on one of said first and second surfaces, said heating element being operable to heat surface regions of said substrate and said movable part, which have been subjected to a stiction, so as to separate the movable part from the substrate.

2. A micro-electromechanical device according to claim 1, wherein said stiction recovery means is provided on said second surface of the movable part.

3. A micro-electromechanical device according to claim 1, wherein said movable part comprises a cantilever.

4. A micro-electromechanical device according to claim 1, wherein said movable part comprises a diaphragm.

5. A method for producing a micro-electromechanical device, comprising the steps of:

preparing a substrate;

forming a heating element on a surface of the substrate, said heating element being adapted to achieve a stiction recovery of a functional element of the device in the form of a movable part;

forming electrodes for supplying electric current to the heating element, on the surface of the substrate;

forming a sacrificial layer on the surface of the substrate;

forming on the sacrificial layer a structure corresponding to the movable part; and subsequently removing the sacrificial layer from the surface of the substrate so as to form the movable part as being connected to the substrate.

6. The method according to claim 5, wherein said movable part is in the form of a cantilever.

7. The method according to claim 5, wherein said movable part is in the form of a diaphragm.

8. In a micro-electromechanical device comprising a substrate, a functional element in the form of a movable part on the substrate, and a stiction recovery means in the form of a heating element which is arranged for one of opposite surfaces of the substrate and the movable part, a method for recovering stiction of the functional part which has been fixedly adhered to the substrate, said method comprising the step of operating the heating element and thereby heat surface regions of the substrate and the movable part, which has been subjected to stiction, for a duration of approximately 25 nanoseconds.

* * * * *